(12) United States Patent
Duan et al.

(10) Patent No.: US 9,270,158 B2
(45) Date of Patent: Feb. 23, 2016

(54) DRIVE TRANSFORMER ISOLATION ADAPTIVE DRIVE CIRCUIT

(71) Applicant: SHENZHEN HUNTKEY ELECTRIC CO., LTD., Shenzhen, Guangdong (CN)

(72) Inventors: Weiyin Duan, Guangdong (CN); Benqiang Wang, Guangdong (CN); Dongliang Yao, Guangdong (CN)

(73) Assignee: SHENZHEN HUNTKEY ELECTRIC CO., LTD., Guangdong (CN)

( * ) Notice: Subject to any disclaimer, the term of this patent is extended or adjusted under 35 U.S.C. 154(b) by 234 days.

(21) Appl. No.: 14/149,792

(22) Filed: Jan. 7, 2014

(65) Prior Publication Data

US 2014/0140102 A1    May 22, 2014

Related U.S. Application Data

(63) Continuation of application No. PCT/CN2012/085548, filed on Nov. 29, 2012.

(30) Foreign Application Priority Data

Nov. 29, 2012  (CN) .......................... 2012 1 0499460

(51) Int. Cl.
*H02M 3/335*  (2006.01)
*H02M 1/08*   (2006.01)
*H02M 1/38*   (2007.01)
*H03K 17/16*  (2006.01)
*H03K 17/691* (2006.01)
*H02M 1/00*   (2007.01)

(52) U.S. Cl.
CPC *H02M 1/08* (2013.01); *H02M 1/38* (2013.01); *H03K 17/162* (2013.01); *H03K 17/691* (2013.01); *H02M 2001/0058* (2013.01); *Y02B 70/1491* (2013.01)

(58) Field of Classification Search
CPC .......................... H02M 3/33592; H03K 17/691
See application file for complete search history.

(56) References Cited

U.S. PATENT DOCUMENTS

| | | | | |
|---|---|---|---|---|
| 5,663,877 A | * | 9/1997 | Dittli | H02M 3/33592 363/127 |
| 7,016,203 B2 | * | 3/2006 | Xu | H02M 3/33592 363/21.04 |

FOREIGN PATENT DOCUMENTS

| | | |
|---|---|---|
| CN | 1909372 | 2/2007 |
| CN | 101771335 | 7/2010 |
| CN | 202424493 | 9/2012 |

* cited by examiner

*Primary Examiner* — Emily P Pham
(74) *Attorney, Agent, or Firm* — Rankin, Hill & Clark LLP

(57) ABSTRACT

A drive transformer isolated-adaptive drive-circuit includes a power supply, a first MOSFET and a second MOSFET, the drain electrode of the first MOSFET coupled with the positive electrode of the power supply, and the source electrode of the first MOSFET coupled with the drain electrode of second MOSFET; the source of the second MOSFET coupled with the negative electrode of the power supply; a drive transformer having a first winding and a second winding; a first fast drive circuit, one end coupled with the first winding, the other end coupled with the first MOSFET; a second fast drive circuit, one end coupled with the second winding, the other end coupled with the second MOSFET; a first adaptive-dead-time control sub-circuit; and a second adaptive-dead-time control sub-circuit.

9 Claims, 2 Drawing Sheets

DRIVE TRANSFORMER ISOLATION ADAPTIVE DRIVE CIRCUIT

TECHNICAL FIELD

The present invention relates to the field of power electronic products technology, and more particularly to a drive transformer isolated-adaptive drive-circuit that used for the full-bridge, half-bridge, and LLC converters.

BACKGROUND

With the intensification of the world energy crisis, reducing energy consumption and protecting environment have become a consensus. In order to improve the efficiency of AC/DC and DC/DC power converters, half bridge, full bridge and LLC resonant converters have been widely used. But the operating frequency of the resonant converter varies with the dynamic changes of the load. The impedance of the gate, and the body-diode reverse recovery time (Trr) may impact on the dead-time control and even change the drive-signal waveform. Up to now, due to the fixed dead-time control, the zero-voltage switch (ZVS) may not be achieved if the dead-time is too long; the short-circuit may take place on one arm of the bridge if the dead-time is too short, less than a body-diode Trr, which may led to the failure of the resonant converter.

SUMMARY

The present invention provides a drive transformer isolated-adaptive drive-circuit which adaptively adjusts the dead-time to get the ZVS, and reduces the distortion and delay of the drive-signal to reduce the switching losses, improve the efficiency, and prevent the short-circuit failure.

In order to realize the above purpose, the present invention provides a drive transformer isolated-adaptive drive-circuit, the drive transformer isolated-adaptive drive-circuit includes:

a power supply, a first MOSFET and a second MOSFET, a drain electrode of the first MOSFET is coupled with a positive electrode of the power supply, and a source electrode of the first MOSFET is coupled with a drain electrode of the second MOSFET; a source electrode of the second MOSFET with a negative electrode of the power supply;

a drive transformer having a first winding and a second winding thereon;

a first unidirectional-positive-voltage fast drive circuit (UPVFDC), wherein one end is coupled with the first winding, and the other end thereof is coupled with a gate electrode of the first MOSFET;

a second unidirectional-positive-voltage fast drive circuit, wherein one end thereof is coupled with the second winding, and the other end thereof is coupled with a gate electrode of the second MOSFET;

a first adaptive-dead-time control sub-circuit (ADTC), used to output corresponding level to the gate electrode of the first MOSFET according to the voltage between the drain electrode and source electrode of the first MOSFET;

a second adaptive-dead-time control sub-circuit, used to output corresponding level to the gate electrode of the second MOSFET according to the voltage between the drain electrode and source electrode of the second MOSFET.

Preferably, the first unidirectional-positive-voltage fast drive circuit includes a first resistor, a second resistor, a first diode and a first triode (Q11), wherein the first triode (Q11) is a PNP triode, a base of the first triode is coupled with one end of the first resistor, the other end of the first resistor is coupled with one end of the first winding, a collector of the first triode is coupled with the other end of the first winding, an emitter of the first triode is coupled with a cathode of the first diode, an anode of the first diode is coupled with one end of the second resistor, the other end of which is coupled to the other end of the first resistor.

Preferably, the second unidirectional-positive-voltage fast drive circuit includes a third resistor, a fourth resistor, a second diode and a second triode (Q12), wherein the second triode (Q12) is a PNP triode, a base of the second triode is coupled with one end of the third resistor, the other end of the third resistor is coupled with the second winding, a collector of the second triode is coupled with the other end of the second winding, an emitter of the second triode is coupled with a cathode of the second diode, an anode of the second diode is coupled with one end of the fourth resistor, the other end of which is coupled to the other end of the third resistor; one end of where the first winding is coupled with the first resistor and one end of where the second winding is coupled with the collector of the second triode are the same name end.

Preferably, the first adaptive-dead-time control sub-circuit includes a third MOSFET, a third diode, a fifth resistor and a sixth resistor, wherein the drain electrode of the third MOSFET is coupled with the gate electrode of the first MOSFET, and a source electrode of the third MOSFET is coupled with the source electrode of the first MOSFET; a gate electrode of the third MOSFET is coupled with the source electrode of the first MOSFET by the fifth resistor, and is coupled with a cathode of the third diode by the sixth resistor, an anode of the third diode is coupled with the drain electrode of the first MOSFET.

Preferably, a first diode group is connected between the gate electrode of the third MOSFET and the fifth resistor, the first diode group includes an input terminal and an output terminal, the input terminal is coupled with one end of the fifth resistor and the sixth resistor, the output terminal is coupled with the gate electrode of the third MOSFET; the first diode group consists of a diode or at least two diodes in series.

Preferably, the first adaptive-dead-time control sub-circuit includes a third triode (Q13), the third triode (Q13) is a PNP triode, an emitter of the third triode is coupled with a gate electrode of the third MOSFET, a collector of the third triode is coupled with the source electrode of the third MOSFET, a base of the third triode is coupled with one end of the fifth resistor and one end of the sixth resistor.

Preferably, the second adaptive-dead-time control sub-circuit includes a fourth MOSFET, a fourth diode, a seventh resistor and an eighth resistor, wherein a drain electrode of the fourth MOSFET is coupled with the gate electrode of the second MOSFET, and a source electrode of the fourth MOSFET is coupled with the source electrode of the second MOSFET; a gate electrode of the fourth MOSFET is coupled with the source electrode of the second MOSFET by the seventh resistor, and is coupled with a cathode of the fourth diode by the eighth resistor, and an anode of the fourth diode is coupled with the drain electrode of the second MOSFET.

Preferably, a second diode group is connected between the gate electrode of the fourth MOSFET and the seventh resistor, the second diode group includes an input terminal and an output terminal, the input terminal is coupled with one end of the seventh resistor and one end of the eighth resistor, the output terminal is coupled with the gate electrode of the fourth MOSFET; the second diode group consists of a diode or at least two diodes in series.

Preferably, the second adaptive-dead-time control sub-circuit includes a fourth triode (Q14), the fourth triode (Q14) is a PNP triode, an emitter of the fourth triode is coupled with the gate electrode of the fourth MOSFET, a collector of the fourth triode is coupled with the source electrode of the fourth MOSFET, a base of the fourth triode is coupled with one end of the seventh resistor and one end of the eighth resistor.

In the present invention, by setting the first unidirectional-positive-voltage fast drive circuit and the second unidirectional-positive-voltage fast drive circuit, when the drive transformer outputs a positive voltage drive signal to a corresponding drive circuit, the corresponding drive circuit outputs a positive voltage drive signal; when the drive transformer outputs a negative voltage drive signal, the output of the corresponding drive circuit is zero, and the current of corresponding drive transformer winding is limited in a few milli-amperes, to reduce power consumption and drive delay. The first adaptive-dead-time control sub-circuit detects the Vds of the first MOSFET, and when the Vds of the first MOSFET is lower than the working voltage, the first adaptive-dead-time control sub-circuit does not work; when the Vds of the first MOSFET is equal to the working voltage, the first adaptive-dead-time control sub-circuit detects the turnon and reverse recovery state of the body diode of the first MOSFET, and adjusts the pulse width of the drive signal accordingly; also the second adaptive-dead-time control sub-circuit is set to detect the Vds of the second MOSFET, and when the Vds of the second MOSFET is lower than the working voltage, the second adaptive-dead-time control sub-circuit does not work; when the Vds of the second MOSFET is equal to the working voltage, the second adaptive-dead-time control sub-circuit detects the turnon and reverse recovery state of the body diode of the second MOSFET, and adjusts the pulse width of the drive signal accordingly to achieve the adjustment of the adaptive dead time control. Accordingly, the drive transformer isolated-adaptive drive-circuit provided by the present invention can reduce distortion and delay of a drive signal, according to the operating current of the transform resonant cavity and the reverse recovery time (Trr) characteristics of the body diode of the first MOSFET and the second MOSFET, the dead-time of the top and bottom MOSFET of the same bridge arm is adjusted adaptively and real-time to get the ZVS, reduce the switching losses, improve efficiency and prevent the short-circuit failure.

The realization, functional characteristics, advantages and embodiments of the present invention will be explained below in detail with reference to the accompanying drawings.

DETAILED DESCRIPTION OF THE PREFERRED EMBODIMENTS

It is to be appreciated that the following description of the embodiment(s) is merely exemplary in nature and is no way intended to limit the present invention, its application, or uses.

Figure 1:
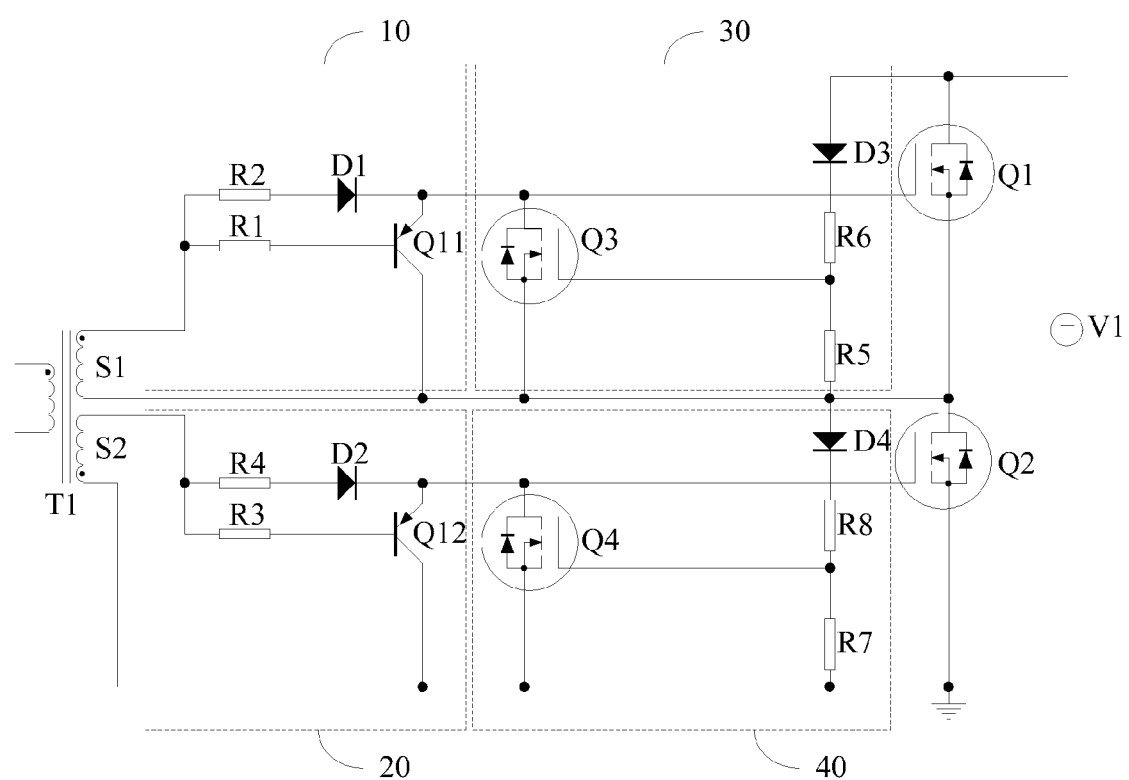
FIG. 1 is a diagram of a drive transformer isolated-adaptive drive-circuit in accordance with a first embodiment of the present invention.

Referring to FIG. 1, FIG. 1 is a diagram of a drive transformer isolated-adaptive drive-circuit in accordance with a first embodiment of the present invention.

A drive transformer isolated-adaptive drive-circuit is provided by the present embodiment, the drive transformer isolated-adaptive drive-circuit includes: a power supply V1, a first MOSFET Q1 and a second MOSFET Q2, a drain electrode of the first MOSFET Q1 is coupled with a positive electrode of the power supply V1, and a source electrode of the first MOSFET Q1 is coupled with a drain electrode of the second MOSFET Q2; a source electrode of the second MOSFET Q2 is coupled with a negative electrode of the power supply V1;

a drive transformer T1 having a first winding S1 and a second winding S2 thereon;

a first unidirectional-positive-voltage fast drive circuit 10, wherein one end thereof is coupled with the first winding S1, and the other end thereof is coupled with a gate electrode of the first MOSFET Q1;

a second unidirectional-positive-voltage fast drive circuit 20, wherein one end thereof is coupled with the second winding S2, and the other end thereof is coupled with a gate electrode of the second MOSFET Q2;

a first adaptive-dead-time control sub-circuit 30, used to output corresponding level to the gate electrode of the first MOSFET according to the voltage between the drain electrode and source electrode of the first MOSFET Q1;

a second adaptive-dead-time control sub-circuit 40, used to output corresponding level to the gate electrode of the second MOSFET according to the voltage between the drain electrode and source electrode of the second MOSFET Q2.

Specifically, the first unidirectional-positive-voltage fast drive circuit 10 includes a first resistor R1, a second resistor R2, a first diode D1 and a first triode Q11, wherein the first triode Q11 is a PNP triode, a base of the first triode is coupled with one end of the first resistor R1, the other end of the first resistor R1 is coupled with one end of the first winding S1, a collector of the first triode is coupled with the other end of the first winding S1, an emitter of the first triode is coupled with a cathode of the first diode D1, an anode of the first diode D1 is coupled with one end of the second resistor R2, the other end of which is connected to the other end of the first resistor R1.

The second unidirectional-positive-voltage fast drive circuit 20 includes a third resistor R3, a fourth resistor R4, a second diode D2 and a second triode (Q12), wherein the second triode (Q12) is a PNP triode, a base of the second triode is coupled with one end of the third resistor R3, the other end of the third resistor R3 is coupled with the second winding S2, a collector of the second triode is coupled with the other end of the second winding S2, an emitter of the second triode is coupled with a cathode of the second diode D2, an anode of the second diode D2 is coupled with one end of the fourth resistor R4, the other end of which is coupled to the other end of the third resistor R3; one end where the first winding S1 is coupled with the first resistor R1 and one end where the second winding S2 is coupled with an collector of the second triode Q12 are the same name end.

The first adaptive-dead-time control sub-circuit 30 includes a third MOSFET Q3, a third diode D3, a fifth resistor R5 and a sixth resistor R6, wherein a drain electrode of the third MOSFET Q3 is coupled with the gate electrode of the first MOSFET Q1, and a source electrode of the third MOSFET Q3 is coupled with the source electrode of the first MOSFET Q1; a gate electrode of the third MOSFET Q3 is coupled with the source electrode of the first MOSFET Q1 by the fifth resistor R5, and is coupled with a cathode of the third diode D3 by the sixth resistor R6, and an anode of the third diode D3 is coupled with the drain electrode of the first MOSFET Q1.

The second adaptive-dead-time control sub-circuit 40 includes a fourth MOSFET Q4, a fourth diode D4, a seventh resistor R7 and an eighth resistor R8, wherein a drain electrode of the fourth MOSFET Q4 is coupled with the gate electrode of the second MOSFET Q2, and a source electrode of the fourth MOSFET Q4 is coupled with the source electrode of the second MOSFET Q2; a gate electrode of the fourth MOSFET Q4 is coupled with the source electrode of the second MOSFET Q2 by the seventh resistor R7, and is coupled with a cathode of the fourth diode D4 by the eighth resistor R8; and an anode of the fourth diode D4 is coupled with the drain electrode of the second MOSFET Q2.

In the present embodiment, a body diode is set in an inner side of MOSFET, before the MOSFET is conducted, the body diode is conducted first, and the turn-off time of the MOSFET depends on reverse recovery time (Trr) and current-flow of the body diode. The first MOSFET Q1 and the second MOSFET Q2 are the top and bottom switches located in the same bridge arm.

The circuit works in a resonant state, when the first MOSFET Q1 and its body diode are turned off, and the second MOSFET Q2 and its body diode are conducted, the voltage Vds between the drain electrode and source electrode of the second MOSFET Q2 is 0V, so that the gate electrode voltage of the fourth MOSFET Q4 is 0V, and the fourth MOSFET Q4 is turned off, the second MOSFET Q2 is conducted by high-level driving signal of the second winding S2 by the fourth resistor R4 and the second diode D2. When the first MOSFET Q1 and its body diode are conducted, and the second MOSFET Q2 and its body diode are turned off, the voltage Vds between the drain electrode and source electrode of the second MOSFET Q2 is 400V, so that the gate electrode voltage of the fourth MOSFET Q4 is equal to the voltage at both ends of the seventh resistor R7, i.e. the gate electrode of the fourth MOSFET Q4 is high level, and the fourth MOSFET Q4 is conducted, so the gate electrode of the second MOSFET Q2 is clamped to 0 by the fourth MOSFET Q4 via the fourth resistor R4 and the second diode D2, so that the signal of the second winding S2 is clamped, and can not drive the second MOSFET Q2. i.e., the dead time of the second MOSFET Q2 is extended, and the drive signal pulse width is narrowed.

When the second MOSFET Q2 and its body diode are turned off, and the first MOSFET Q1 and its body diode are conducted, the voltage Vds between the drain electrode and source electrode of the first MOSFET Q1 is 0V, so that gate electrode voltage of the third MOSFET Q3 is 0V, and the third MOSFET Q3 is turned off, the first MOSFET Q1 is conducted by high-level driving signal of the first winding S1 by the second resistor R2 and the first diode D1. When the second MOSFET Q2 and its body diode are conducted, and the first MOSFET Q1 and its body diode are turned off, the voltage Vds between the drain electrode and source electrode of the first MOSFET Q1 is 400V, so that the gate electrode voltage of the third MOSFET Q3 is equal to the voltage at both ends of the fifth resistor R5, i.e. the gate electrode voltage of the third FET Q3 is high level, and the third MOSFET Q3 is conducted, so the gate electrode of the first MOSFET Q1 is clamped to 0 by the third MOSFET Q3 via the second resistor R2 and the first diode D1, so that the high-level signal of the first winding S1 is clamped, and can not drive the first MOSFET Q1. I.e., the dead time of the first MOSFET Q1 is extended, and the drive signal pulse width is narrowed.

When the high level of the first winding S1 reaches to 15V, and the third MOSFET Q3 is turned off, the first MOSFET Q1 is conducted by the drive signal via the second resistor R2 and the first diode D1. When the level of the first winding S1 reduced from 15V high level to −15V low level, the first triode Q11 is conducted, and the first MOSFET Q1 is turned off quickly through the first resistor R1. It should be noted that, in the present embodiment, the conduction speed of the first MOSFET Q1 can be adjusted by adjusting the resistance of the second resistor R2; the turnoff speed of the first MOSFET Q1 can be adjusted by adjusting the resistance of the first resistor R1.

When the high level of the second winding S2 reaches to 15V, and the fourth MOSFET Q4 is turned off, the second MOSFET Q2 is conducted by the drive signal via the fourth resistor R4 and the second diode D2. When the level of the second winding S2 reduced from 15V high level to −15V low level, the second triode Q12 is conducted, and the second MOSFET Q2 is quickly turned off through the third resistor R3. It should be noted that, in the present embodiment, the conduction speed of the second MOSFET Q2 can be adjusted by adjusting the resistance of the fourth resistor R4; the turn-off speed of the second FET Q2 can be adjusted by adjusting the resistance of the third resistor R3.

In summary, by setting the first unidirectional-positive-voltage fast drive circuit and the second unidirectional-positive-voltage fast drive circuit, when the drive transformer outputs a positive voltage drive signal to a corresponding drive circuit, the corresponding drive circuit outputs a positive voltage drive signal; when the drive transformer outputs a negative voltage drive signal, the output of the corresponding drive circuit is zero, and the current of corresponding drive transformer winding is limited within a few milli-amperes, to reduce power consumption and drive delay. The first adaptive-dead-time control sub-circuit detects the Vds of the first MOSFET, and when the Vds of the first MOSFET is lower than the working voltage, the first adaptive dead-time control sub-circuit does not work; when the Vds of the first MOSFET is equal to the working voltage, the first adaptive-dead-time control sub-circuit detects the turnon and reverse recovery state of the body diode of the first MOSFET, and adjusts the pulse width of the drive signal accordingly; also the second adaptive-dead-time control sub-circuit is set to detect the Vds of the second MOSFET, and when the Vds of the second MOSFET is lower than the working voltage, the second adaptive-dead-time control sub-circuit does not work; when the Vds of the second MOSFET is equal to the working voltage, the second adaptive-dead-time control sub-circuit detects the turnon and reverse recovery state of the body diode of the second MOSFET, and adjusts the pulse width of the drive signal accordingly to achieve the adjustment of the adaptive dead time. Accordingly, the drive transformer isolated-adaptive drive-circuit provided by the present invention can reduce distortion and delay of a drive signal, according to the operating current of the transform resonant cavity and the reverse recovery time (Trr) characteristics of the body diode of the first MOSFET and the second MOSFET, the dead time of the top and down MOSFET of the same bridge arm are adjusted adaptively and real-time to get the ZVS, reduce the switching losses, improve efficiency and prevent the short-circuit failure.

It should be noted that the power supply V1 is a DC power supply of 280-430V.

Figure 2:
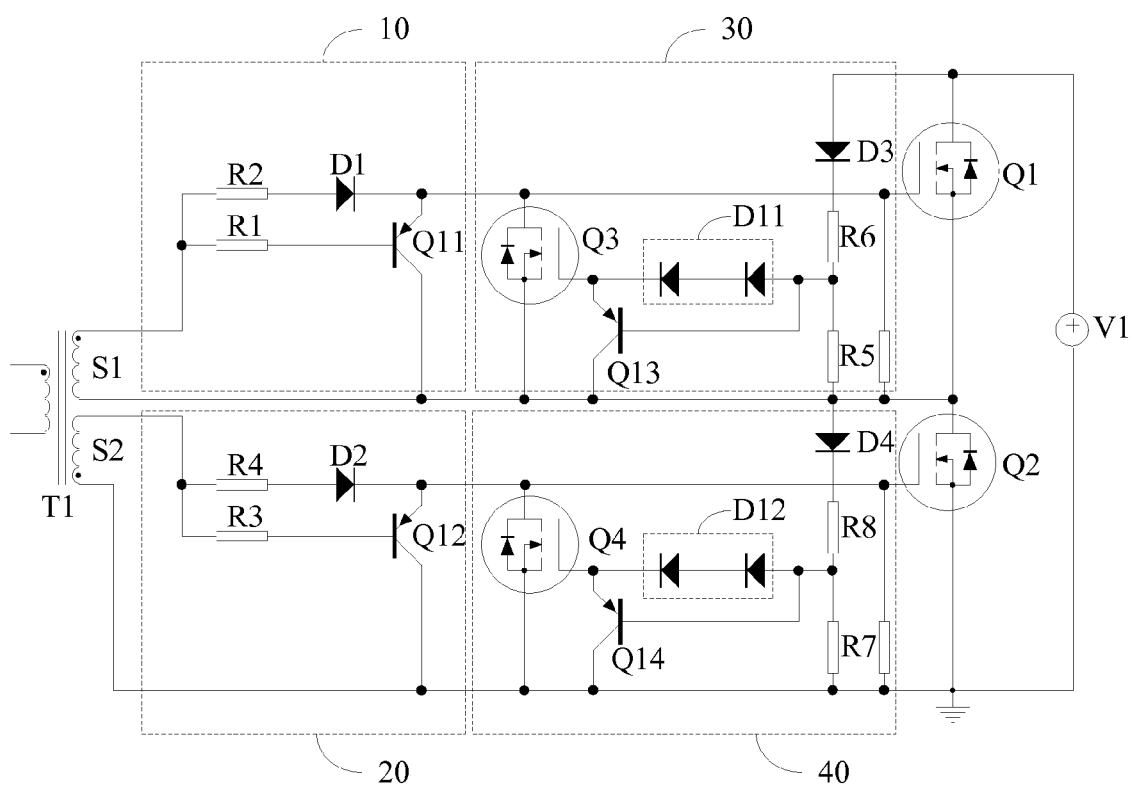
FIG. 2 is a diagram of a drive transformer isolated-adaptive drive-circuit in accordance with a second embodiment of the present invention.

Further, referring to FIG. 2, FIG. 2 is a diagram of a drive transformer isolated-adaptive drive-circuit in accordance with a second embodiment of the present invention. Based on the above embodiment, in the present embodiment, a first diode group D11 is connected between the gate electrode of the third MOSFET Q3 and the fifth resistor R5, the first diode group D11 includes an input terminal and an output terminal, the input terminal is coupled with one end of the fifth resistor R5 and the sixth resistor R6, the output terminal is coupled with the gate electrode of the third MOSFET Q3; the first diode group D11 consists of a diode or at least two diodes in series. The first adaptive-dead-time control sub-circuit 30 includes a third triode Q13, the third triode Q13 is a PNP triode, an emitter of the third triode is coupled with a gate electrode of the third MOSFET Q3, a collector of the third triode is coupled with the source electrode of the third MOSFET Q3, and a base of the third triode is coupled with one end of the fifth resistor R5 and one end of the sixth resistor R6.

A second diode group D12 is connected between the gate electrode of the fourth MOSFET Q4 and the seventh resistor R7, the second diode group D12 includes an input terminal and an output terminal, the input terminal is coupled with one end of the seventh resistor R7 and one end of the eighth resistor R8, the output terminal is coupled with the gate electrode of the fourth MOSFET Q4; the second diode group D12 consists of a diode or at least two diodes in series. The second adaptive-dead-time control sub-circuit 40 includes a fourth triode Q14, the fourth triode Q14 is a PNP triode, an emitter of the fourth triode is coupled with the gate electrode of the fourth MOSFET Q4, a collector of the Q14 is coupled with the source electrode of the fourth FET Q4, a base of the Q14 is coupled with one end of the seventh resistor R7 and one end of the eighth resistor R8.

In the present embodiment, the first diode group D11 consisting of two diodes is explained in detail. Such as, a first diode group includes a forestage diode and a post-stage diode, a cathode of the forestage diode is the output terminal, and an anode of the post-stage diode is the output terminal, and the anode of the forestage diode is coupled with the cathode of the post-stage diode. Because the first diode group D11 is added to the gate electrode of the third MOSFET Q3, so the threshold voltage of the gate electrode drive of the third MOSFET Q3 can be improved. For example, the third MOSFET Q3 adopts a MOSFET with 2V, the voltage across the fifth resistor R5 should be higher than 3.4V to conduct the third MOSFET Q3. Therefore, in the present invention, the MOSFET can be chosen to be suitable for different drive voltages by adjusting the number of the first diode group D11, and the corresponding MOSFET doesn't work during the startup and shutdown process, thereby increasing practicality of the circuit. It should be understood that the principle of the second diode group D12 is in accord with the principle of the first diode group D11, so it is not repeated here.

The present invention may be embodied in other forms without departing from the spirit or novel characteristics thereof. The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A drive transformer isolated-adaptive drive-circuit, the circuit comprises:
    a power supply, a first MOSFET and a second MOSFET, a drain electrode of the first MOSFET is coupled with a positive electrode of the power supply, and a source electrode of the first MOSFET is coupled with a drain electrode of the second MOSFET; a source electrode of the second MOSFET is coupled with a negative electrode of the power supply;
    a drive transformer having a first winding and a second winding thereon;
    a first unidirectional-positive-voltage fast drive circuit, wherein one end thereof is coupled with the first winding, and other end thereof is coupled with a gate electrode of the first MOSFET;
    a second unidirectional-positive-voltage fast drive circuit, wherein one end thereof is coupled with the second winding, and other end thereof is coupled with a gate electrode of the second MOSFET;
    a first adaptive-dead-time control sub-circuit, used to output corresponding level to the gate electrode of the first MOSFET according to voltage between the drain electrode and source electrode of the first MOSFET;
    a second adaptive-dead-time control sub-circuit, used to output corresponding level to the gate electrode of the second MOSFET according to voltage between the drain electrode and source electrode of the second MOSFET.

2. The drive transformer isolated-adaptive drive-circuit as claimed in claim 1, wherein the first unidirectional-positive-voltage fast drive circuit comprises a first resistor, a second resistor, a first diode and a first triode (Q11), wherein the first triode (Q11) is a PNP triode, a base of the first triode is coupled with one end of the first resistor, the other end of the first resistor is coupled with one end of the first winding, a collector of the first triode is coupled with the other end of the first winding, an emitter of the first triode is coupled with a cathode of the first diode, an anode of the first diode is coupled with one end of the second resistor, the other end of which is connected to the other end of the first resistor.

3. The drive transformer isolated-adaptive drive-circuit as claimed in claim 2, wherein the second unidirectional-positive-voltage fast drive circuit comprises a third resistor, a fourth resistor, a second diode and a second triode (Q12), wherein the second triode (Q12) is a PNP triode, a base of the second triode is coupled with one end of the third resistor, the other end of the third resistor is coupled with the second winding, a collector electrode of the second triode is coupled with the other end of the second winding, an emitter of the second triode is coupled with a cathode of the second diode, an anode of the second diode is coupled with end of the fourth resistor, the other end of which is coupled to the other end of the third resistor; one end where the first winding is coupled with the first resistor and one end where the second winding is coupled with the collector of the second triode are the same name end.

4. The drive transformer isolated-adaptive drive-circuit as claimed in claim 1, wherein the first adaptive-dead-time control sub-circuit comprises a third MOSFET, a third diode, a fifth resistor and a sixth resistor, wherein a drain electrode of the third MOSFET is coupled with the gate electrode of the first MOSFET, and a source electrode of the third MOSFET is coupled with the source electrode of the first MOSFET; a gate electrode of the third MOSFET is coupled with the source electrode of the first MOSFET by the fifth resistor, and is coupled with a cathode of the third diode by the sixth resistor, and an anode of the third diode is coupled with the drain electrode of the first MOSFET.

5. The drive transformer isolated-adaptive drive-circuit as claimed in claim 4, wherein a first diode group is connected between the gate electrode of the third MOSFET and the fifth resistor, the first diode group comprises an input terminal and an output terminal, the input terminal is coupled with one end of the fifth resistor and the sixth resistor, the output terminal is coupled with the gate electrode of the third MOSFET; the first diode group consists of a diode or at least two diodes in series.

6. The drive transformer isolated-adaptive drive-circuit as claimed in claim 5, wherein the first adaptive-dead-time control sub-circuit comprises a third triode (Q13), the third triode (Q13) is a PNP triode, an emitter of the third triode is coupled with a gate electrode of the third MOSFET, a collector of the third triode is coupled with the source electrode of the third MOSFET, a base of the third triode is coupled with one end of the fifth resistor and one end of the sixth resistor.

7. The drive transformer isolated-adaptive drive-circuit as claimed in claim 1, wherein the second adaptive-dead-time control sub-circuit comprises a fourth MOSFET, a fourth diode, a seventh resistor and an eighth resistor, wherein a drain electrode of the fourth MOSFET is coupled with the gate electrode of the second MOSFET, and a source electrode of the fourth MOSFET is coupled with the source electrode of the second MOSFET; a gate electrode of the fourth MOSFET is coupled with the source electrode of the second MOSFET by the seventh resistor, and is coupled with a cathode of the fourth diode by the eighth resistor, and an anode of the fourth diode is coupled with the drain electrode of the second MOSFET.

8. The drive transformer isolated-adaptive drive-circuit as claimed in claim 7, wherein a second diode group is connected between the gate electrode of the fourth MOSFET and the seventh resistor, the second diode group comprises an input terminal and an output terminal, the input terminal is coupled with one end of the seventh resistor and one end of the eighth resistor, the output terminal is coupled with the gate electrode of the fourth MOSFET; the second diode group consists of a diode or at least two diodes in series.

9. The drive transformer isolated-adaptive drive-circuit as claimed in claim 8, wherein the second adaptive-dead-time control sub-circuit further comprises a fourth triode (Q14), the fourth triode (Q14) is a PNP triode, an emitter of the fourth triode is coupled with the gate electrode of the fourth MOSFET, a collector of the fourth triode is coupled with the source electrode of the fourth MOSFET, a base of the fourth triode is coupled with one end of the seventh resistor and one end of the eighth resistor.

* * * * *